United States Patent
Degen et al.

(10) Patent No.: US 10,458,814 B2
(45) Date of Patent: Oct. 29, 2019

(54) DEVICE FOR DETERMINING A POSITION OF AN ELEMENT

(71) Applicant: ZF Friedrichshafen AG, Friedrichshafen (DE)

(72) Inventors: Joachim Degen, Schermbeck (DE); Jorg Jahn, Bünde (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 15/538,160

(22) PCT Filed: Dec. 15, 2015

(86) PCT No.: PCT/EP2015/079701
§ 371 (c)(1),
(2) Date: Jun. 20, 2017

(87) PCT Pub. No.: WO2016/113058
PCT Pub. Date: Jul. 21, 2016

(65) Prior Publication Data
US 2018/0052010 A1    Feb. 22, 2018

(30) Foreign Application Priority Data

Jan. 16, 2015   (DE) .................. 10 2015 200 619

(51) Int. Cl.
*G01D 5/20*      (2006.01)
*G01D 5/244*     (2006.01)
(Continued)

(52) U.S. Cl.
CPC .............. *G01D 5/20* (2013.01); *G01D 5/202* (2013.01); *G01D 5/2006* (2013.01);
(Continued)

(58) Field of Classification Search
None
See application file for complete search history.

(56) References Cited

U.S. PATENT DOCUMENTS 6,750,658 B2 *   6/2004   Hofmann ................ B66B 13/26
                                                   324/654
7,161,348 B2 *   1/2007   Luber .................... G01D 5/202
                                                   324/207.15
(Continued)

FOREIGN PATENT DOCUMENTS

DE      198 06 529 A1    8/1999
DE      198 30 570 A1    1/2000
(Continued)

OTHER PUBLICATIONS

International Search Report and Written Opinion from corresponding International Application No. PCT/EP2015/079701, 3pp., dated Jul. 21, 2016.
(Continued)

*Primary Examiner* — Douglas X Rodriguez
(74) *Attorney, Agent, or Firm* — Brinks Gilson & Lione

(57) ABSTRACT

A device for inductive positioning comprises a coil, an element for influencing a magnetic field in the area of the coil, a signal generator for providing a digital signal and a delay element with an input and an output, wherein the delay element is designed on the basis of the coil and a delay period between a signal edge at the input and a corresponding signal edge at the output is dependent on the inductance of the coil. The device further comprises a comparator to provide a digital differential impulse, whose length is dependent on a time difference of corresponding signal edges at the input and the output of the delay element, an integrator to provide a voltage depending on the length of the differential impulse and an evaluator to determine the position of the coil in reference to the coil based the voltage.

20 Claims, 4 Drawing Sheets

(51) Int. Cl.
*H03K 5/24* (2006.01)
*H03K 19/21* (2006.01)

(52) U.S. Cl.
CPC ........... G01D 5/2013 (2013.01); G01D 5/244 (2013.01); *H03K 5/24* (2013.01); *H03K 19/21* (2013.01)

(56) References Cited

U.S. PATENT DOCUMENTS

| | | | | |
|---|---|---|---|---|
| 2008/0174302 A1* | 7/2008 | Lee | ............ | G01D 5/2046 324/207.16 |
| 2010/0201380 A1* | 8/2010 | Del Monte | ............ | G01V 3/10 324/655 |
| 2012/0112769 A1* | 5/2012 | Palmer | ............ | G01B 7/023 324/654 |

FOREIGN PATENT DOCUMENTS

| | | |
|---|---|---|
| DE | 201 05 164 U1 | 6/2001 |
| DE | 101 25 278 A1 | 12/2002 |
| DE | 20 2004 019489 A1 | 5/2005 |
| DE | 10 2004 033085 A1 | 1/2006 |
| DE | 10 2010 042 816 A1 | 4/2012 |
| DE | 10 2013 019 168 A1 | 2/2015 |
| EP | 1248369 A2 | 10/2001 |
| EP | 1251228 | 10/2002 |
| EP | 1688709 | 8/2006 |
| EP | 1 884 749 A1 | 2/2008 |
| WO | WO 2004 027 994 A1 | 3/2004 |

OTHER PUBLICATIONS

Office Action from corresponding German application No. DE102015 200 619.0 , 9pp., dated Oct. 20, 2015.

* cited by examiner

DEVICE FOR DETERMINING A POSITION OF AN ELEMENT

RELATED APPLICATIONS

This application is a filing under 35 U.S.C. § 371 of International Patent Application PCT/EP2015/079701, filed Dec. 15, 2015, and claims the priority of DE 10 2015 200 619.0, filed Jan. 16, 2015, both of which are incorporated by reference herein in their entirety.

BACKGROUND OF THE INVENTION

1. Field of the Invention

The invention concerns an inductive positioning. The invention, in particular, concerns the determination of a relative position of a device aboard a motor vehicle.

2. Background Information

A selector lever is intended on a motor vehicle to influence a gear engaged in a transmission. The selector level may be brought into different positions by the driver, wherein the selector lever can be guided in a motion link. The position of the selector lever is scanned and is processed electrically or electronically. A control device can then control the transmission based on the driver's wishes expressed by the position of the selector lever.

The position of the selector lever can be scanned by a series of coils mounted to a console and an electrically conductive damping element mounted to the selector lever, which is movable with respect to the console. The closer the damping element is to one of the coils, the more the inductivity of this coil is reduced by means of the damping element. The damping element normally consists of a well conductive material such as copper, aluminum, or brass.

DE 20 2004 019 489 U1 shows an inductive sensor unit that works according to this principle. However, relatively large inductances must normally be used for this measurement method. If the coil is to be executed as a printed circuit, several layers, which are complex to manufacture, need to often be used for this purpose. The coils must also be manufactured with high accuracy and must then be tested, which may lead to further costs in production. This type of position measurement may also require a multistage electronic amplification and may still require an inverter.

BRIEF SUMMARY

It is the task of the invention to specify an improved device for the inductive positioning. The invention solves this task by means of a device with the features of the independent claim. Dependent claims describe preferred embodiments.

One device for the inductive positioning comprises a coil, an element for influencing a magnetic field in the area of the coil, a signal generator for providing a digital signal, and a delay element with an input and an output, wherein the delay element is built on the basis of the coil and a delay period between a signal edge at the input and a corresponding signal edge at the output is dependent on the inductance of the coil. The device further comprises a comparator to provide a digital differential impulse, whose length depends on a time difference of corresponding signal edges at the input and the output of the delay element, an integrator for supplying a voltage in dependence of the length of the differential impulse, and an evaluator for determining the position of the coil in reference to the coil based on the voltage.

When compared with a conventional determination of inductance, the described device can be set up more easily. Parts of the device may be implemented with customary logic gates. The device can be impervious to component tolerances. The device may also be suitable for the integration or partial implementation by a programmable microcomputer.

In one preferred embodiment, the delay element comprises an R-L low-pass. The delay element can thus be built up to a coil with just one passive component. The delay element can thus be executed simply, inexpensively, and with a compact design.

It is furthermore preferred that the signal generator provides alternating rising and falling signal edges and that the comparator is adapted to provide a first differential impulse in answer to a rising signal edge and a second differential impulse in answer to a falling signal edge, whereby the differential impulses have the same polarity and the integrator is set up to provide the voltage with several differential impulses depending on the lengths.

Due to the evaluation of rising and falling signal edges, a measuring voltage provided by the integrator can be increased or can be provided more quickly. A signal-to-noise ratio (SNR) can thus be increased.

In a particularly preferred embodiment, signal edges have the same polarity at the input and the output of the comparator and the comparator comprises an exclusive-or logic (XOR logic). The above-described evaluation of opposing signal edges can thus be implemented easily and cost-effectively. The logic can be implemented as a simple standard gate.

Two coils are intended in another embodiment, both of which are assigned to a delay element, a comparator, and an integrator, whereby the element is configured to influence the magnetic fields of both coils and the evaluator is adapted to determine the position of the element based on voltages from both integrators.

In other words, the position of the element can be determined with a resolution that is smaller than the distance of the two coils. The position can be derived from a ratio of the voltage, for instance. Further embodiments with more than two coils influenced simultaneously are also possible.

The evaluator can be adapted to determine the position of the element based on the voltage by means of a predetermined characteristic curve. The characteristic curve can in particular specify a connection between a certain voltage and a distance of the element from the coil. A characteristic map may also be specified in another embodiment, indicating a position of the element in reference to several coils on the basis of several voltages. Nonlinearities of the connection can thus easily be dealt with.

If the coil only has a low inductance, for example, when it is executed as a flat coil, such as a printed circuit, several differential impulses must usually be further added or integrated to provide a usable measuring voltage. The number of considered differential impulses can be varied to correct nonlinearity. This can particularly be useful with an inductance located at the lower measurement limit of the device. In one embodiment, the integrator is configured to provide the voltage on the basis of a number of differential impulses, wherein the number is selected depending on an inductance of the coil uninfluenced by the element. In another embodiment, a known reference inductance may be used instead of the coil to determine the preferred number of considered differential impulses. Such a calibration can be performed once or cyclically during the operation of the device.

Preferably, provision is made for an arrangement of several coils, where each coil is assigned to a delay element, a comparator, and an integrator, where the element on a trajectory is movable, which leads through areas of the coils and where the evaluator is configured to determine the position of the element based on voltages from the integrators in terms of the arrangement. For example, the coils can be arranged so that their longitudinal axes cross the trajectory, wherein the trajectory preferably passes above the coils at a constant height. It is further preferred that the coils have the same distances in terms of the trajectory, particularly when the element is configured to influence more than one coil simultaneously. In this embodiment, the position of the element on the trajectory can be determined easily and relatively accurately.

Preferably, a joint evaluator is provided for several integrators. The evaluator may in particular comprise an analog-to-digital converter and a programmable microcomputer. It is further preferred that the signal from the signal generator is made available to the delay elements using the time-division multiplexing method. The signal of the signal generator is always only supplied to one of the delay elements. Connecting the signal to the individual delay elements can be controlled by the evaluator, for instance.

The coil may comprise a flat coil. The coil can thus have a simple design, such as a printed circuit. In one preferred embodiment, the coil comprises a multi-layered flat coil, which can be designed in the form of different levels of a double-sided or multi-level circuit board, for example.

It is further preferred that a soft-magnetic core is provided on the coil. In the case of the flat coil, the soft-magnetic core can be arranged on the upper side, the lower side, or between different levels of the coil, for example.

BRIEF DESCRIPTION OF THE DRAWINGS

The invention is now described in greater detail with reference to the enclosed figure, in which.

DETAILED DESCRIPTION

Figure 1:
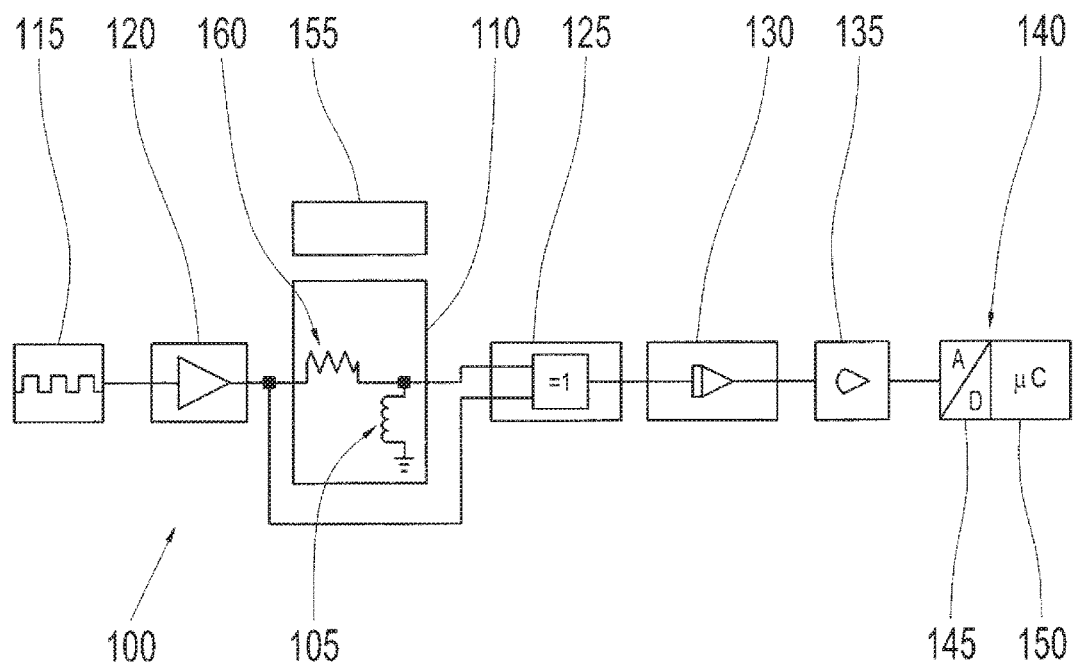
FIG. 1 depicts a block diagram of a device for the inductive positioning.

FIG. 1 shows a block diagram of a device 100 for the inductive positioning. The device 100 can be used aboard a motor vehicle, for instance, to determine a position of a selector lever for a gear of an automatic transmission, a position of an adjustable seat, a position of an adjustable outside mirror, or a position of a movable gas pedal. Other positions aboard the motor vehicles may also be included.

The device 100 comprises a coil 105, which is part of a delay element 110, a signal generator 115, an optional buffer 120, a comparator 125, an integrator 130, an optional amplifier 135, and an evaluator that may comprise an analog-to-digital converter 145 and a programmable microcomputer, in particular. An element 155 for influencing a magnetic field is also provided in the area of the coil 105. The element 155 that is arranged movable to the coil 105 will be explained in detail below.

The signal generator 115 is configured to provide a digital signal with a signal edge. The signal edge can be rising or falling or signal edges rising and falling alternately may be emitted, such as in the form of a square wave signal. The signal generator 115 in one embodiment may be controlled or implemented by means of the evaluator 140, particularly the microcomputer. The optional buffer 120 serves to amplify the provided signal or to reduce the output impedance of the signal generator 115.

In the embodiment shown, the delay element 110 is depicted as an R-L low-pass in connection with a resistor 160. Other embodiments that comprise a mono-stable multi-vibrator, for instance, are also possible. The delay element 110 is configured to provide another signal edge at its output in answer to a signal edge at its input in each case, wherein a time difference, therefore a time gap of the two signal edges, is dependent on the inductance of the coil 105. It is generally preferred that a rising signal edge at the input produces a rising signal edge at the output and that a falling signal edge at the input produces a falling signal edge at the output.

Based on the signals at the input and output of the delay element 110, the comparator 125 provides a digital differential impulse, whose length is dependent on the time difference between a signal edge at the input and a corresponding signal edge at the output of the delay element 110. In the preferred embodiments shown, corresponding signal edges at the input and output of the delay element 110 have the same polarities, a rising edge of an input signal therefore also results in a rising edge of an input signal after the delay period, and a falling edge of the input signal results in a falling edge of the output signal after the delay period. The comparator 125 can thus be implemented as XOR Logic, particularly as an XOR gate, such as in CMOS or TTL technology. In case there are other polarities or combinations of polarities, a different gate or a combination of gates can be used as the comparator 125.

In a simple embodiment, the integrator 130 can be designed as an RC element using a resistor and a capacitor. In another embodiment, the integrator 130 may also be realized using a respective connected operational amplifier. The optional amplifier 135 can also be realized through an operational amplifier, where the amplifier 135 can be omitted, especially if the integrator 130 is designed on the basis of an operational amplifier. The amplifier 135 amplifies the voltage provided by the integrator 130 whose level is dependent on the length of the differential impulse of the comparator 125.

Figure 2:
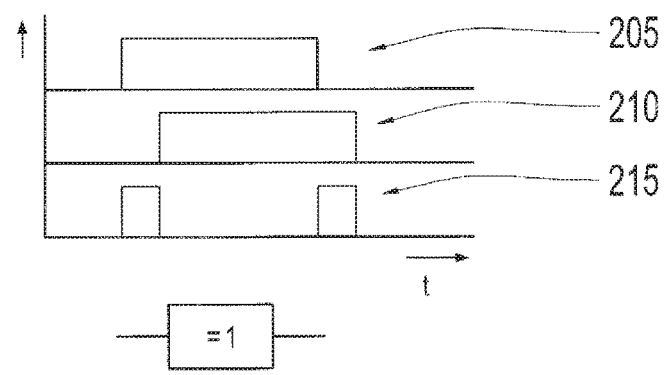
FIG. 2 depicts an impulse diagram on the comparator of the device of FIG. 1.

FIG. 2 shows an impulse diagram on the comparator 125 of the device 100 of FIG. 1. A time is marked in horizontal direction and a voltage is marked in vertical direction. A first signal 205 is provided by the signal generator 115 by way of example, a second signal 210 is provided by the delay element 110 on the basis of the first signal 205, and a third signal 215 comprises a differential impulse provided by the comparator 125.

The comparator 125 designed as a XOR gate switches the output to logical 1 if precisely one of the signals 205 and 210 is logic 1 and the other is logic 0. A first differential impulse is therefore emitted between the rising signal edge of the first signal 205 and the rising signal edge of the second signal 210 and a second differential impulse is emitted between the falling signal edge of the first signal 205 and the falling signal edge of the second signal 210. If the signals 205 and 210 have different polarities, one of the signals 205 and 210 can be inverted as to compare the signals 205 and 210 using the comparator 125.

If the coil 105 is supplied with the digital signal of the signal generator 115, a magnetic field will form in its area, which is influenced stronger or weaker depending on the position of the element 155. Accordingly, the induction of the coil 105 is dependent on the position of the element 155. The induction of the coil 105 determines the delay period of the delay element 110 and thus the length of each differential impulse of the third signal 215. In one embodiment, in which the element 155 positively influences the induction of the coil 105, meaning where it enlarges it when approaching the coil, the presence of the element 155 can be recognized in the area of the coil 105 by that the differential impulses of the third signal 215 reach a predetermined length.

One or preferably several differential impulses of the third signal 215 are additionally integrated by means of the integrator 130 to supply a voltage whose level depends on the length of the differential impulses of the third signal 215. In the given example, the presence of the element 155 can be recognized in the area of the coil 105 by that the voltage of the integrator 130 exceeds a predetermined threshold value.

Figure 3:
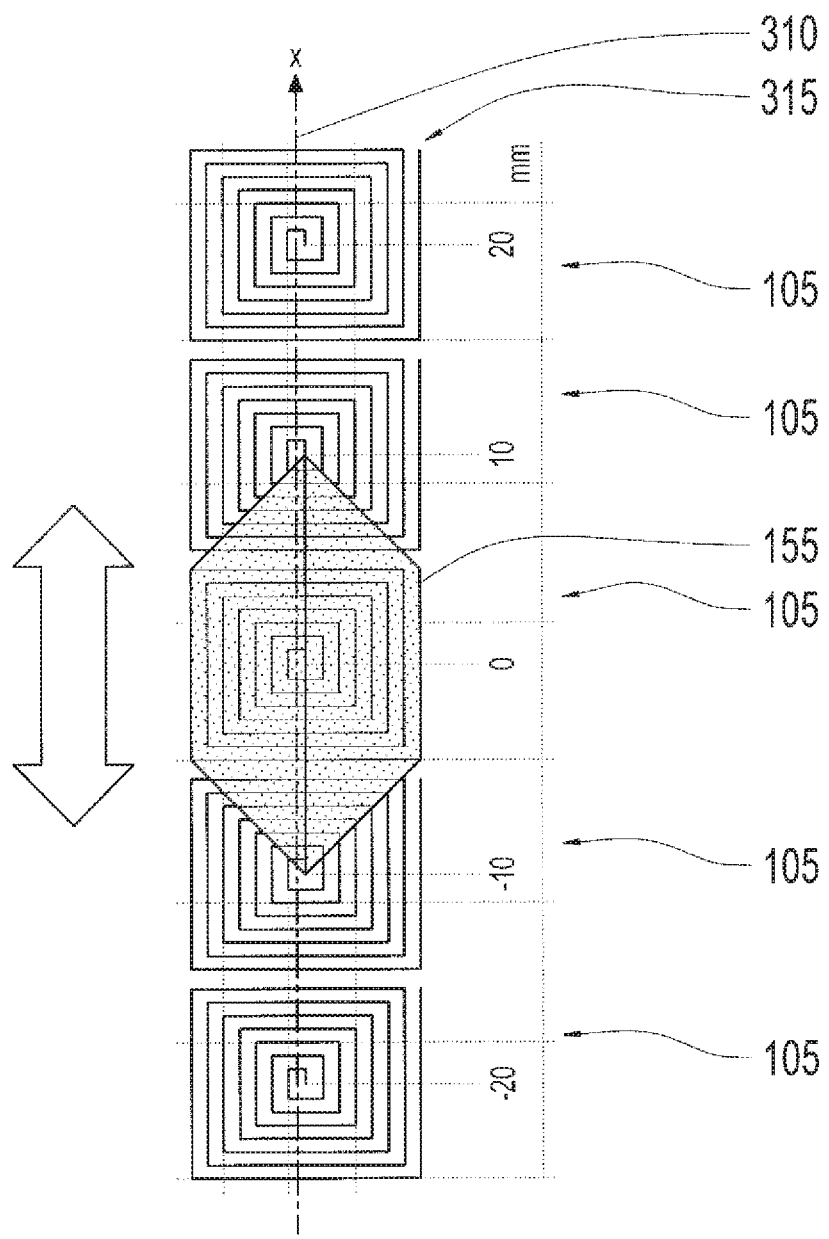
FIG. 3 depicts an arrangement of coils on the device of FIG. 1.

FIG. 3 shows an arrangement 305 of coils 105 on the device 100 of FIG. 1. The exemplary arrangement 305 comprises several coils 105 that can especially be designed as flat coils. Instead of the rectangular coils shown, round or differently shaped coils 105 may also be used. The coils 105 are arranged along a trajectory 310, which run straight as portrayed or which can follow a curve. Longitudinal axes of the coils 105 preferably intersect the trajectory 310. It is also preferred that the coils 105 lie close to each other. Optionally, a soft-magnetic core 315 can be provided on a coil 105 to increase the coil inductance. In the case of flat coils, the soft-magnetic core 315 can be attached flat underneath or above the coil 105.

A trajectory 310 runs through areas of the coils 105. It is particularly preferred that the trajectory 310 runs through longitudinal axes of the coils 105, and namely further preferred at a constant height above the individual coils 105. The trajectory 310 can thereby assume the shape of any desired curve, also circular, for example. The element 155 for influencing the magnetic field of a coil 105 is arranged movable along the trajectory 310. In reference to the following figure, one position of the element 155 along the trajectory 310 is listed in millimeters in the portrayed exemplary embodiment.

The element 155 can be designed flat with a thickness of less than one millimeter. Its outlines are preferably chosen to cover the surface of at least one coil 105. Preferably, the outlines are even greater so that it additionally covers at least one adjacent coil 105 to a predetermined part at the same time.

The element 155 can be made from different materials and when approaching a coil 105 can alternately contribute to the decrease or increase of its magnetic field as is shown in the following figure.

Figure 4:
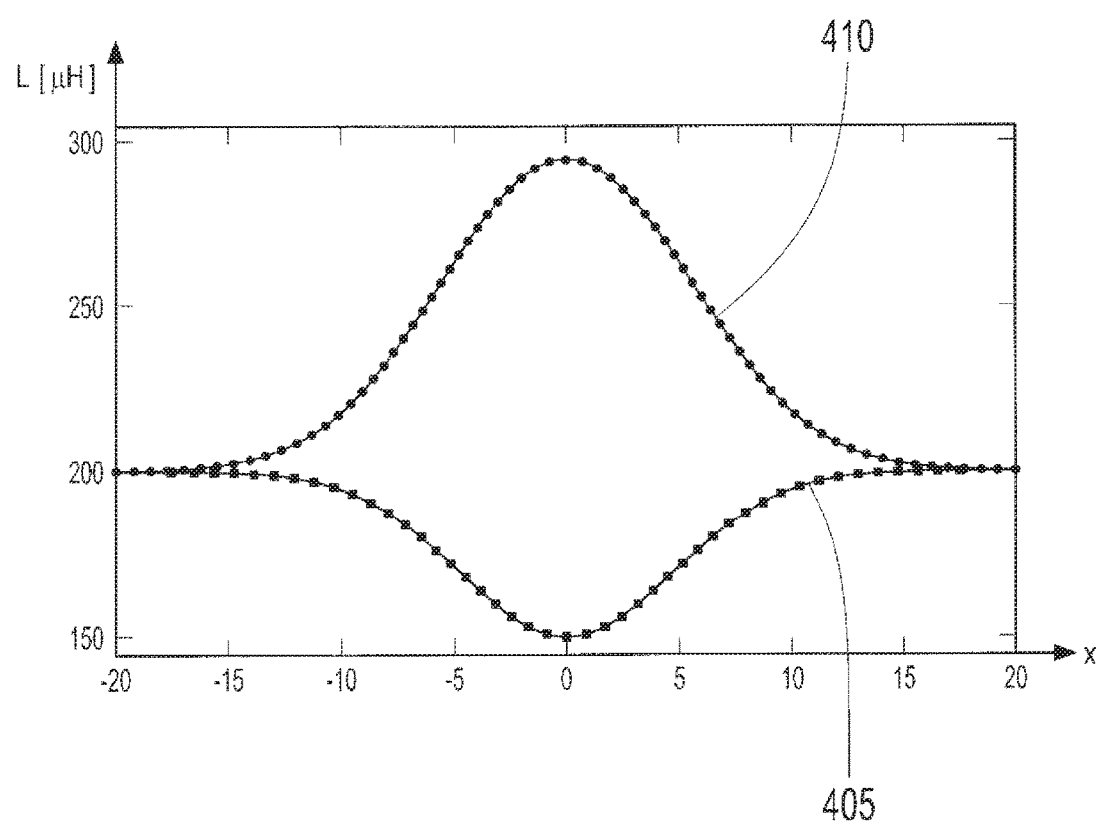
FIG. 4 depicts characteristic curves of the coil of FIG. 1.

FIG. 4 shows characteristic curves of the coil 105 of FIG. 1. The position of the element 155 is marked in horizontal direction in the representation of FIG. 3, and the inductance of the coil 105 is marked in vertical direction.

A first characteristic curve 405 relates to a damping element 155 that can particularly be made from a well-conductive material such as copper or aluminum. A second characteristic curve 410 relates to a reinforcing element 155 that can comprise a soft-magnetic material such as ferrite, in particular. The characteristic curves 405 or 410 can be stored in the evaluator 140 in order to determine the position of the element 155 on the basis of the inductance of the coil 105 in a simplified manner.

Figure 5:
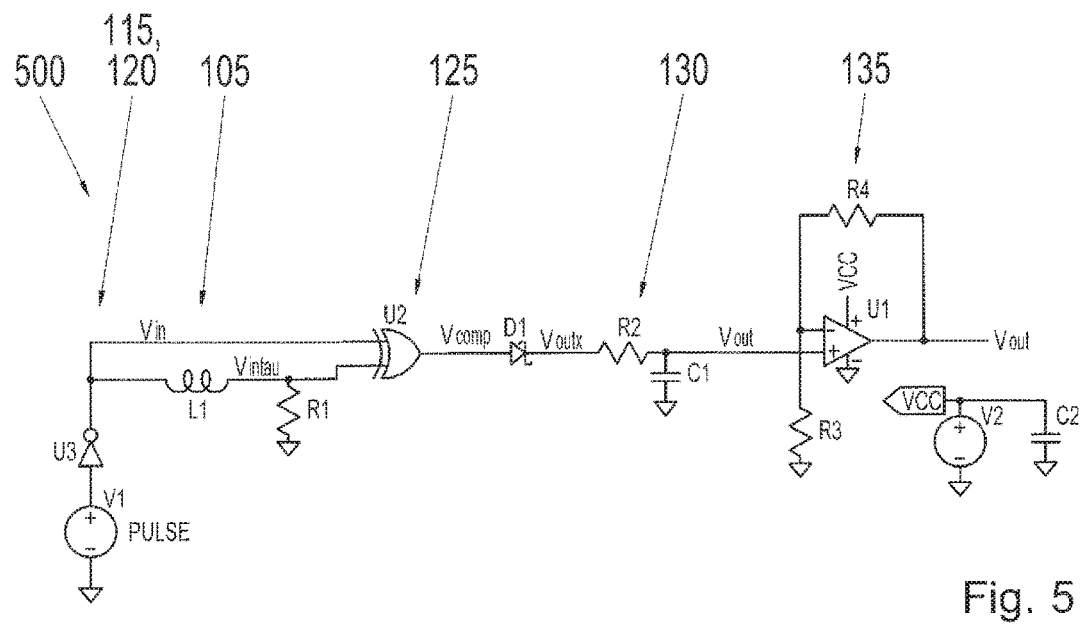
FIG. 5 depicts a circuit example for the device of FIG. 1.
Figure 6:
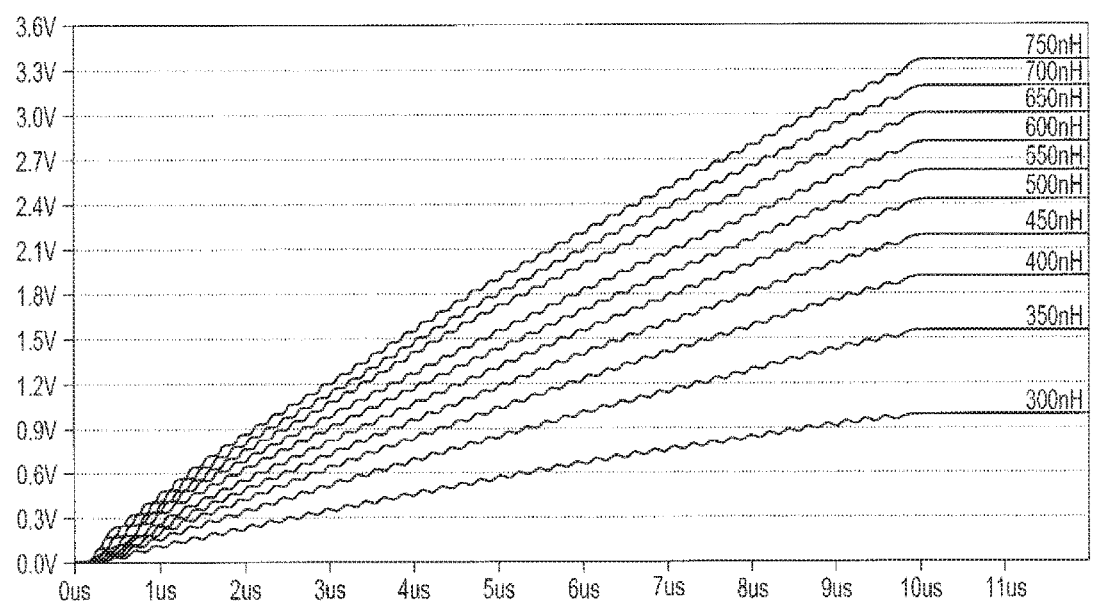
FIG. 6 depicts the expected voltages on the circuit example of FIG. 5.

FIG. 5 shows a circuit example 500 for the device 100 of FIG. 1. FIG. 6 shows expected voltages on the integrator 130, if the circuit 500 is operated through the signal generator 115 with differently long impulses and with differently large inductances of the coil 105. In FIG. 6, the impulse length is marked in horizontal direction and the resulting voltage is marked in vertical direction on the integrator 130 for different inductances. The example of FIGS. 5 and 6 shows how components of the device 100 can be dimensioned to generate a measurement signal to easily be evaluated on the integrator 130 depending on the inductance of the coil 105.

REFERENCE SIGNS

100 Device
105 Coil
110 Delay element
115 Signal generator
120 Buffer
125 Comparator
130 Integrator
135 Amplifier
140 Evaluator
145 A-D converter
150 Microcomputer
155 Element for influencing
160 Resistance
205 first signal
210 second signal
215 third signal
305 Arrangement
310 Trajectory
315 soft-magnetic core
405 first characteristic curve
410 second characteristic curve
500 Circuit example

What is claimed is:

1. A device for inductive positioning determination, comprising:
   a coil;
   an element for influencing a magnetic field in an area of the coil, wherein the element is selectively movable relative to the coil between a plurality of positions;
   a signal generator for providing a digital signal;
   a delay element with an input and an output, wherein the delay element includes the coil and a delay period between a signal edge at the input of the delay element and a corresponding signal edge at the output of the delay element is dependent on an inductance of the coil;
   a comparator for providing a digital differential impulse, the digital differential impulse having a length dependent on a time difference of corresponding signal edges at the input and the output of the delay element;
   an integrator for providing a voltage depending on the length of the digital differential impulse; and
   an evaluator configured to provide an analog determination of the distance between the element and the coil based on the voltage provided by the integrator.

2. The device according to claim 1, wherein the delay element comprises a resistor-inductor configuration.

3. The device according to claim 1, wherein the signal generator provides alternately rising and falling signal edges and the comparator is configured to:
provide a first digital differential impulse in response to a rising signal edge, and
provide a second digital differential impulse in response to a falling signal edge,
wherein the first digital differential impulse and the second digital differential impulse have the same polarity and the integrator is configured to provide the voltage depending on lengths of several digital differential impulses.

4. The device according to claim 1, wherein the signal edges at an input and an output of the comparator have the same polarity and the comparator comprises exclusive-or (XOR) logic.

5. The device according to claim 1, wherein two coils are provided, each coil of the two coils is assigned to the delay element, the comparator, and the integrator, the element is configured to influence magnetic fields of the two coils and the evaluator is configured to determine a position of the element on the basis of voltages from both integrators.

6. The device according to claim 1, wherein the evaluator is configured to determine a position of the element on the basis of the voltage by means of a predetermined characteristic curve.

7. The device according to claim 1, wherein the integrator is configured to provide the voltage on the basis of a number of digital differential impulses, and wherein the number of the digital differential impulses is selected depending on the inductance of the coil uninfluenced by the element.

8. The device according to claim 1, comprising an arrangement of several coils, wherein each coil in the arrangement of several coils is assigned to a delay element, a comparator and an integrator, the element on a trajectory is movable, which leads through areas of the arrangement of several coils and wherein the evaluator is configured to determine a position of the element on the basis of voltages from the integrators with respect to the arrangement of several coils.

9. The device according to claim 8, wherein a joint evaluator is provided for several integrators of the integrators and the digital signal of the signal generator is made available to the delay elements using a time-division multiplexing method.

10. The device according to claim 1, wherein the coil comprises a flat coil.

11. The device according to claim 1, further comprising a soft-magnetic core on the coil.

12. A device for inductive position determination of an element, the device comprising:
a coil;
an element for influencing a magnetic field in an area of the coil, wherein the element is selectively movable relative to the coil between a plurality of positions;
a signal generator for providing a digital signal;
a delay element having an input and an output, the delay element developed based on the coil and a delay period between a signal edge at the input of the delay element and a corresponding signal edge at the output of the delay element is dependent on an inductance of the coil;
a comparator for providing a digital differential impulse, the digital differential impulse having a length dependent on a time difference of the signal edge at the input of the delay element and the corresponding signal edge at the output of the delay element;
an integrator for providing a voltage depending on the length of the digital differential impulse; and
an evaluator configured to provide an analog determination of the distance between the element and the coil based on the voltage provided by the integrator.

13. The device according to claim 12, wherein the delay element comprises a resistor-inductor configuration.

14. The device according to claim 12, wherein the comparator is configured to:
provide a first digital differential impulse in response to a rising signal edge provided by the signal generator, and
provide a second digital differential impulse in response to a falling signal edge provided by the signal generator,
wherein the first digital differential impulse and the second digital differential impulse have the same polarity.

15. The device according to claim 14, wherein the integrator is configured to provide the voltage depending on lengths of several digital differential impulses.

16. The device according to claim 12, wherein a signal edge at an input of the comparator and a signal edge at an output of the comparator have the same polarity and the comparator comprises exclusive-or (XOR) logic.

17. The device according to claim 12, wherein the evaluator is configured to determine a position of the element on the basis of the voltage by means of a predetermined characteristic curve.

18. The device according to claim 12, wherein the integrator is configured to provide the voltage on the basis of a number of the digital differential impulses, and wherein the number of the digital differential impulses is selected depending on an inductance of the coil uninfluenced by the element.

19. The device according to claim 12, wherein the coil comprises a flat coil.

20. The device according to claim 12, further comprising a soft-magnetic core on the coil.

* * * * *